United States Patent [19]
Morgan

[11] Patent Number: 6,067,273
[45] Date of Patent: May 23, 2000

[54] SEMICONDUCTOR MEMORY BURST LENGTH COUNT DETERMINATION DETECTOR

[75] Inventor: Donald Morgan, Boise, Id.

[73] Assignee: Micron Technology, Inc., Boise, Id.

[21] Appl. No.: 09/363,194

[22] Filed: Jul. 29, 1999

Related U.S. Application Data

[63] Continuation of application No. 09/032,122, Feb. 27, 1998, Pat. No. 5,973,993.

[51] Int. Cl.$^7$ ........................................................ G11C 8/00
[52] U.S. Cl. ............................ 365/236; 365/233; 377/26; 377/44; 377/114
[58] Field of Search ..................................... 365/236, 194, 365/233; 379/26, 44, 114

[56] References Cited

U.S. PATENT DOCUMENTS

| | | |
|---|---|---|
| 5,193,193 | 3/1993 | Iyer . |
| 5,481,581 | 1/1996 | Jonas, Jr. . |
| 5,568,445 | 10/1996 | Park et al. . |
| 5,579,530 | 11/1996 | Solomon et al. . |
| 5,590,086 | 12/1996 | Park et al. . |
| 5,594,765 | 1/1997 | Oh . |
| 5,596,616 | 1/1997 | Jeang . |
| 5,602,798 | 2/1997 | Sato et al. . |
| 5,608,686 | 3/1997 | Takai . |
| 5,610,874 | 3/1997 | Park et al. . |
| 5,636,173 | 6/1997 | Schaefer . |
| 5,748,560 | 5/1998 | Sawada . |
| 5,764,584 | 6/1998 | Fukiage et al. . |
| 5,805,523 | 9/1998 | Lysinger . |
| 5,825,691 | 10/1998 | McClure . |
| 5,835,443 | 11/1998 | Fujita . |

*Primary Examiner*—David Nelms
*Assistant Examiner*—Gene N. Auduong
*Attorney, Agent, or Firm*—Kirkpatrick & Lockhart LLP

[57] ABSTRACT

The present invention is directed to a circuit for detecting the end of a burst count in a semiconductor memory device. The circuit is responsive to a plurality of burst counter output bits and a plurality of burst length selection bits. The circuit is comprised of an array of individual semiconductor devices responsive to the burst counter output bits and the burst length selection bits for producing a transition in an output signal when the burst counter output bits are at a logical combination determined by the burst length selection bits. A method for detecting the end of a burst count in a semiconductor memory device is also disclosed.

37 Claims, 8 Drawing Sheets

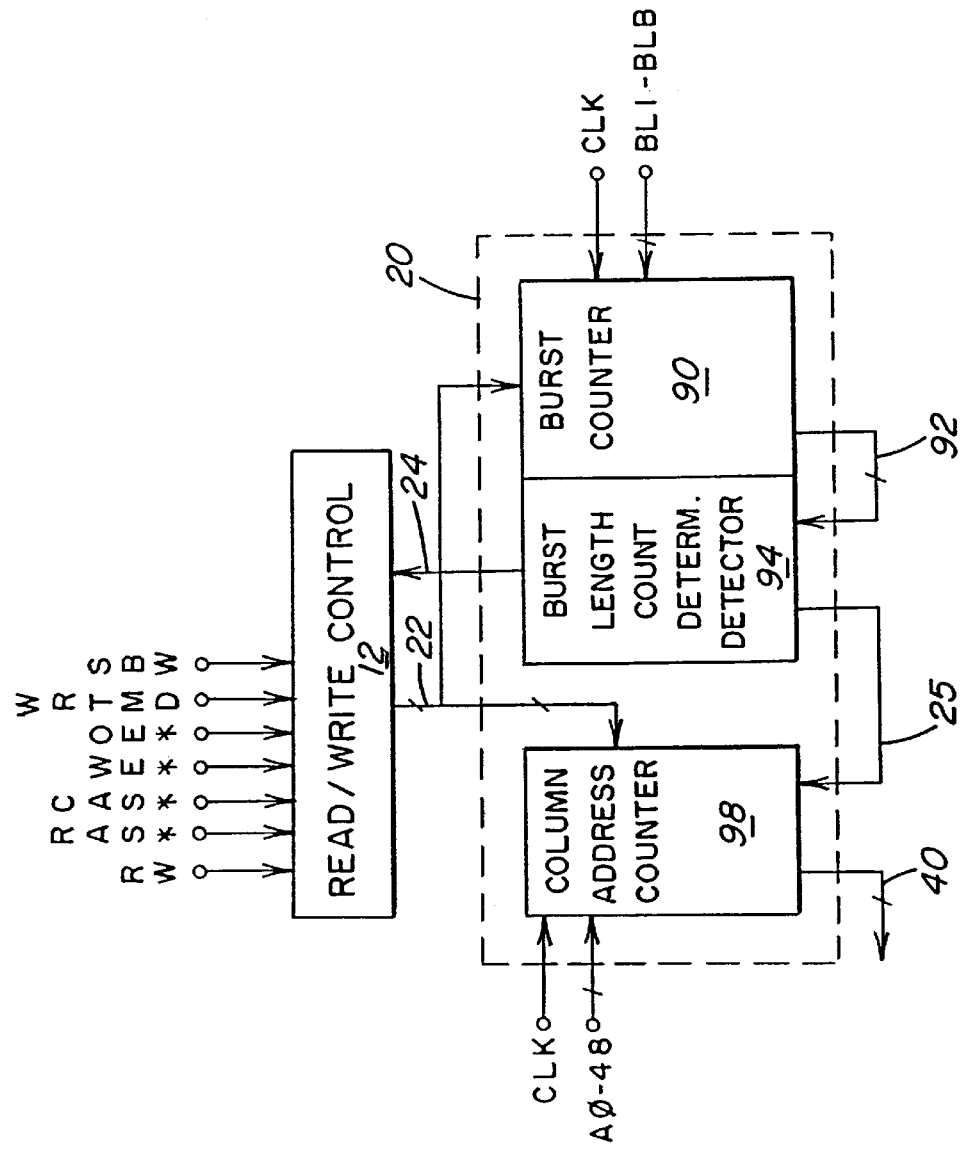

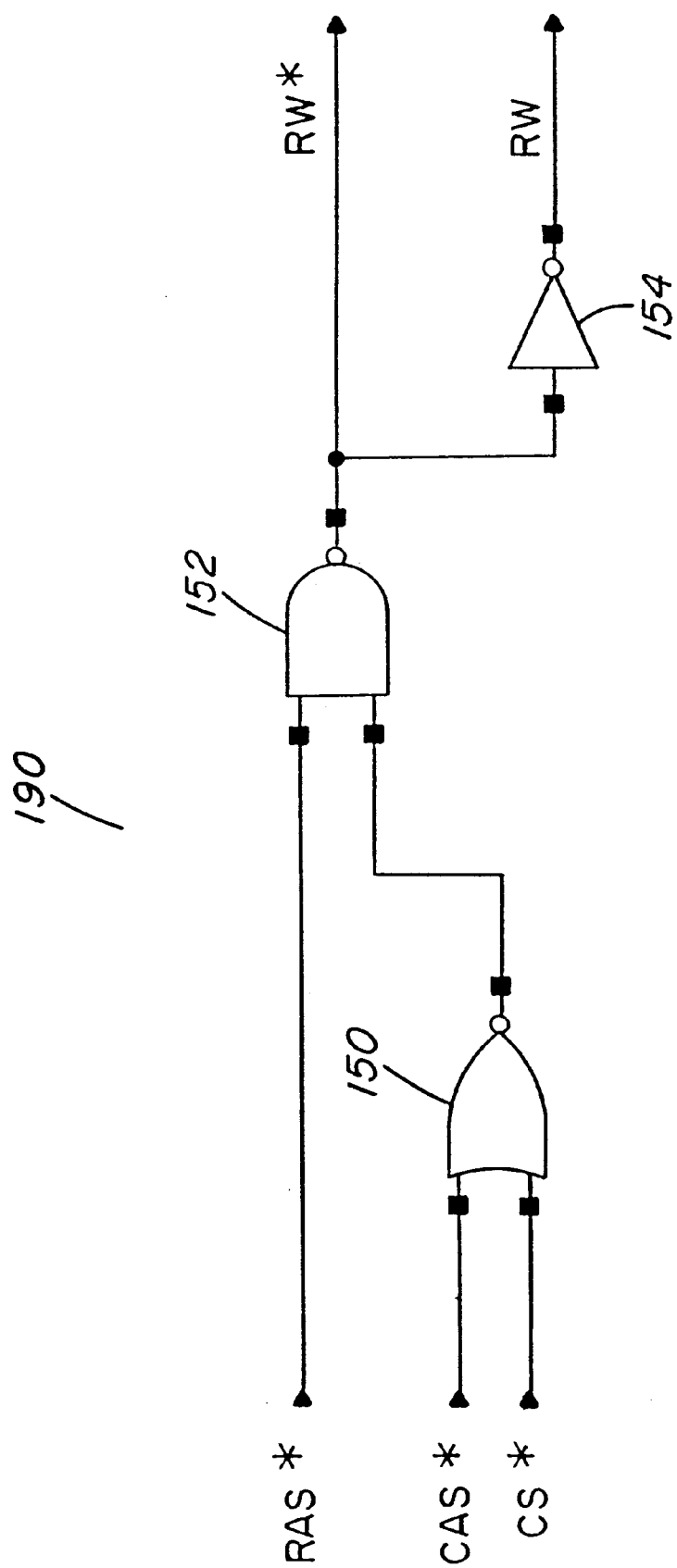

SEMICONDUCTOR MEMORY BURST LENGTH COUNT DETERMINATION DETECTOR

CROSS-REFERENCE TO RELATED APPLICATIONS

This is a continuation of U.S. patent application Ser. No. 09/032,122, filed on Feb. 27, 1998 now U.S. Pat. No. 5,973,993.

BACKGROUND OF THE INVENTION

1. Field of the Invention

The present invention is directed generally to a semiconductor memory device, and, more particularly, to a semiconductor memory burst length count determination detector circuit.

2. Description of the Background

In a conventional memory device, an address and a read or write command are presented to the device. A clock internal to the device controls the time at which the read or write command is performed. An address must be presented for each memory location at which a read or write is desired. The speed of completion of the read or write is thus limited by the speed of the internal clock. The internal clock must also operate compatibly with the speed of the microprocessor. Memory device read and write operations are often performed on sequentially addressable locations, or blocks of data, of the device. Each sequential address must be presented to the memory device at a cost of system speed and resources.

Synchronous semiconductor memory devices have been developed to eliminate the problems inherent in internally clocked memory devices. Typical synchronous memory devices operate in a burst mode. In burst mode, an external address and a read or write command are presented to the memory device and the address is latched into a burst counter. The burst counter is connected to a burst address decoder which decodes the first address and presents it to the array of memory cells within the device to complete the read or write operation. The burst counter then increments or decrements the address in response to a clock that is synchronous with the processing speed of the microprocessor. The address is incremented or decremented depending on the burst length of the memory device. Thus, the addresses of sequential locations in the device are generated internally, making read or write operations to sequential memory locations more efficient.

Typical synchronous memory devices have burst counters that are capable of operation in either a linear burst mode, an interleaved burst mode, or both a sequential burst mode and an interleaved burst mode. Burst counters that operate in the linear burst mode increment the external address and each subsequent internally generated address by 1 upon each tick of the synchronous clock. Burst counters that operate in the interleaved burst mode invert the least significant bit of the external address to form the first internal address. Subsequently, the counter alternately inverts the two least significant bits of the prior internal address and the least significant bits of the prior internal address. The interleaved burst mode is a more efficient method of generating burst addresses in cache memory devices, which typically have data arranged in blocks of data, or pages, that are copied from a main memory device. The interleaved burst mode of operation ensures that the remainder of a page of data will be loaded into the cache device if the initial load address is in the middle of a page.

It is desirable for a synchronous memory device that operates in burst mode to have a burst length count determination detector in communication with the burst length counter. A typical burst length count determination detector receives the outputs of the burst counter and receives control signals that can be used to select the burst length. The burst length count determination detector compares the burst length counter outputs with the burst length inputs to determine when the burst operation has completed. The burst length count determination detector outputs a signal that signals the end of the burst operation. The signal is useful to turn the column address decoder and the input and output buffers off at the completion of the burst operation, thus resulting in a power savings. Also, certain circuits are reset and available for subsequent operations, or the signal may trigger subsequent operations.

SUMMARY OF THE INVENTION

The present invention, according to its broadest implementation, is directed to a circuit for detecting the end of a burst count in a semiconductor memory device. The circuit is responsive to a plurality of burst counter output bits and a plurality of burst length selection bits. The circuit comprises an array of individual semiconductor devices responsive to the burst counter output bits and the burst length selection bits. The array of devices produces a transition in an output signal when the burst counter output bits are at a logical combination determined by the burst length selection bits.

The present invention represents a substantial advance over prior methods and circuits for detecting when the burst length count has reached a predetermined count. Because the present invention uses less semiconductor devices than prior art burst length count determination detectors, the present invention consumes less on-chip area and provides for faster circuit operation. Those, and other advantages and benefits of the present invention, will become apparent from the Detailed Description of the Invention hereinbelow.

BRIEF DESCRIPTION OF THE DRAWINGS

For the present invention to be clearly understood and readily practiced, the present invention will be described in conjunction with the following figures, wherein:

FIG. 2 is a diagram illustrating certain of the features of the read/write control circuit and the column address logic circuit of FIG. 1.

FIG. 2A is a circuit diagram illustrating a decoder circuit;

DETAILED DESCRIPTION OF THE PREFERRED EMBODIMENTS

It is to be understood that the figures and descriptions of the present invention have been simplified to illustrate elements that are relevant for a clear understanding of the present invention, while eliminating, for purposes of clarity, many other elements found in a typical memory system. Those of ordinary skill in the art will recognize that other elements are desirable and/or required to implement a memory device incorporating the present invention. However, because such elements are well known in the art, and because they do not facilitate a better understanding of the present invention, a discussion of such elements is not provided herein.

As used and described herein, a signal followed by an asterisk ("*") indicates that the signal is a logical complement of a signal having the same designation but without the asterisk, e.g., C*<0> is the logical complement of C<0>. Similarly, input and output terminal designations that are followed by an asterisk are active low inputs and outputs, e.g., row address strobe RAS* is active low, meaning that the row address is strobed when a logic low state signal is present at terminal RAS*.

Figure 1:
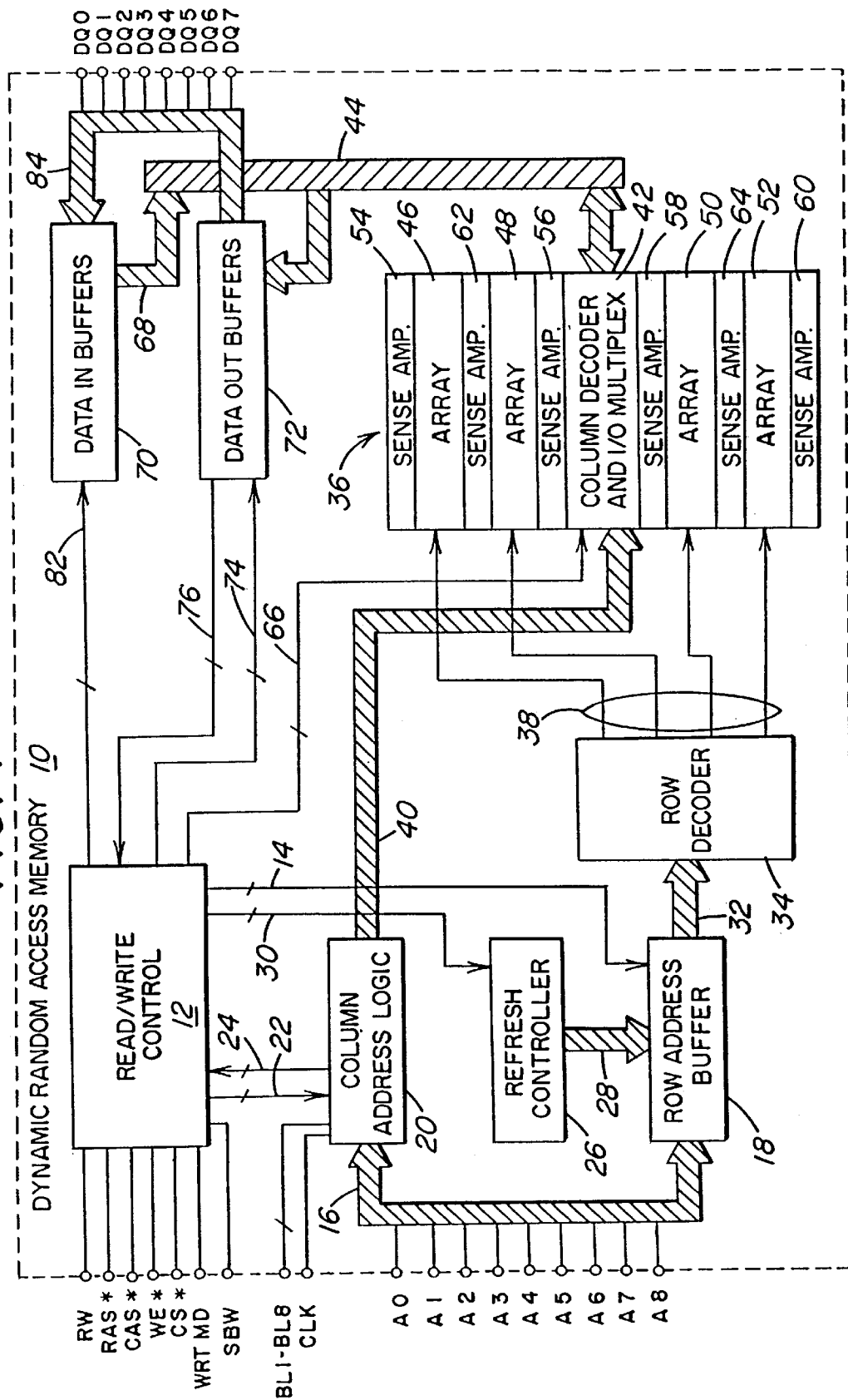
FIG. 1 is a diagram illustrating synchronous dynamic random access memory.

FIG. 1 illustrates a synchronous dynamic random access memory device 10. Input control signals row address strobe (RAS*), column address strobe (CAS*), write enable (WE*), and chip select (CS*) are input to a read/write control circuit 12. When the signals RAS* and CS* are at logic low states and the signals CAS* and WE* are at logic high states when the CLK signal transitions to a logic high state, the read/write control circuit 12 generates control signals 14 which control the latching of the contents of an address bus 16 into a row address buffer 18. The contents of the address bus 16 are also latched into a column address logic circuit 20 in response to control signals 22. The column address logic circuit contains a burst length counter and a burst length count determination detector. An end of burst signal 24 is supplied to the read/write control circuit 12 by the burst length count determination detector.

A refresh controller circuit 26 generates the contents of a row address bus 28 in response to control signals 30 which are generated by the read/write control circuit 12 when the signals RAS* and CAS* are in logic low states and the signal WE* is in a logic high state as the CLK signal transitions from a logic low state to a logic high state. The row address buffer 18 generates the contents of a row address bus 32, which is input to a row decoder circuit 34. The contents of the row address bus 32 represent either the address latched into the row address buffer 18 or the refresh address provided by the refresh controller 26, depending on whether the desired operation is a normal operation or a refresh operation.

The row address buffer 18 and the column address logic circuit 20 determine which memory cell in a memory array 36 will be selected for a read or a write operation. The row decoder 34 activates one or more row activating signals 38. The column address logic circuit 20 generates the contents of a column address bus 40, which are input to a column decoder 42. The column decoder 42 selects one or more columns of the memory array 36, selects a pair of input/output lines, and couples the input/output lines to a global input/output bus 44. The memory array 36 consists of a multiple of, for example, four arrays 46, 48, 50, and 52. Sense amplifiers 54, 56, 58, 60, 62, and 64 are distributed along each bitline pair (not shown). The sense amplifiers 54, 56, 58, 60, 62, and 64 are responsive to control signals 66. In refresh mode, the content of a memory cell is refreshed by the sense amplifiers 54, 56, 58, 60, 62, and 64. During a write operation, the sense amplifiers 54, 56, 58, 60, 62, and 64 establish the proper cell contents in response to write data signals 68 from data in buffers 70. During a read operation, the sense amplifiers 54, 56, 58, 60, 62, and 64 amplify the content of the read cell and present it to data output buffers 72 on the global input/output bus 44. The data output buffers 72 receive control signals 74 and provide feedback signals 76 to the read/write control circuit 12.

The read/write control circuit 12 provides control signals 82 to the data in buffers 70. The data in buffers 70 are driven by a data bus 84, which is connected to, in the example shown in FIG. 1, individual input/output pads DQ0 through DQ7. The read/write control circuit 12 oversees these various operations in response to valid logical combinations of the signals RAS*, CAS*, WE*, and CS* which are decoded when the CLK signal transitions from a logic low state to a logic high state.

FIG. 2 illustrates a portion of the dynamic random access memory device 10 of FIG. 1. The read/write control circuit 12 is illustrated with a portion of the column address logic circuit 20. Only the relevant portions and relevant input and output signals of the column address logic circuit 20 are illustrated. It can be understood by those skilled in the art that the column address logic circuit 20 may contain additional circuitry and may have additional inputs and outputs.

The column address logic circuit 20 contains a burst counter 90. The burst counter 90 is incremented at each pulse of the system clock signal CLK until a counter reset signal is received from the read/write control circuit 12. The burst counter 90 communicates a plurality of counter output bits 92 to a burst length count determination detector 94. The burst length count determination detector 94 determines when the burst counter reaches a predetermined count, as selected by burst length control signals BL1 through BL8, and produces an output signal 25. The burst length control signals BL1 through BL8 can be logically switched at any time during the operation of the dynamic memory device 10. The output signal 25 is communicated to a column address counter 98, which generates an address that is sent to the column decoder 42 via the column address bus 40.

FIG. 2A illustrates a decoder circuit 190 which is used to decode the opcode supplied by an external controller (not shown). The decoder circuit 190 functions to recognize a read or a write command. A NOR gate 150 receives the signals CAS* and CS* as inputs. The output of the NOR gate 150 is at a logic high state when both CAS* and CS* are at logic low states. A NAND gate 152 receives the output of the NOR gate 150 and the signal RAS* as inputs. When RAS* is at a logic high state and CAS* and CS* are at logic low states, the output of the NOR gate 152, signal RW*, is at an active logic low state. An inverter 154 receives the signal RW* as an input and inverts RW* to produce signal RW.

Commands such as a read or write command are supplied by the external controller. Each read or write command is sent with a burst start address. Commands and addresses must be valid a specified amount of Lime before the clock signal CLK transitions to a logic high state to validate the command. Transitions through certain commands which are not validated by a clock pulse are possible. In such cases, no action is performed.

Figure 3:
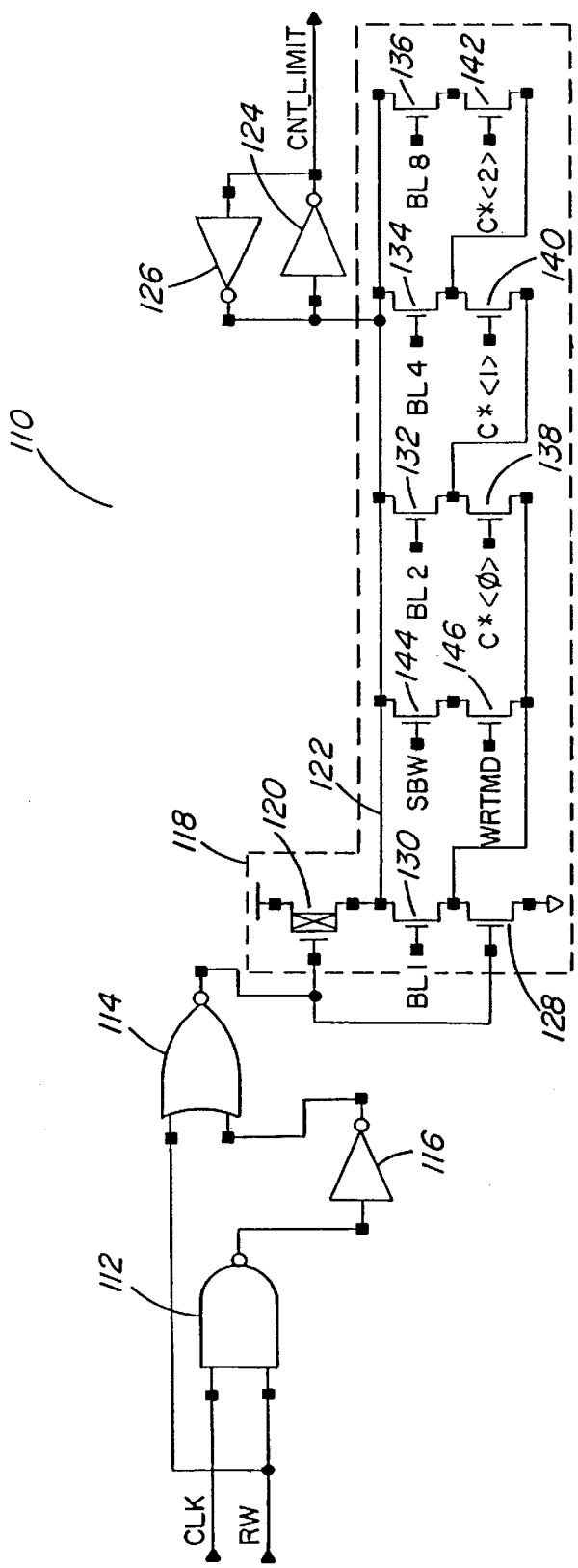
FIG. 3 is a circuit diagram of a burst length count determination detector according to a preferred embodiment of the present invention.

FIG. 3 illustrates a preferred embodiment 110 of the burst length count determination detector 94 of FIG. 2. The detector 110 receives the system clock signal CLK and the read/write signal RW (from a decoder circuit such as that shown in FIG. 2A), which are input to a NAND gate 112. The signal RW is also routed to an input of a NOR gate 114. When the RW signal attains a logic high state prior to the clock signal CLK transitioning to a logic high state, the logic high input to the NOR gate 114 forces the output of the NOR gate 114 to a logic low state. If the logic high state of the RW signal is not validated by the clock signal CLK transitioning to a logic high state, but instead transitions back to a logic low state without being validated, the output of the NOR gate 114 returns to a logic high state. This enables an array of semiconductor devices 118 to monitor burst length counter signals as discussed hereinbelow.

If the RW signal transitions to a logic high state and is subsequently validated by a logic high transition of the CLK signal, the inputs to the NAND gate 112, which are at logic high states, cause the output of the NAND gate 112 to transition to a logic low state. The output of the NAND gate 112 is input to an inverter 116. In the preferred embodiment shown in FIG. 3, the inverter 116 is sized and skewed in such a manner as to cause a logic low input to quickly supply a logic high output. A logic high input to the inverter 116 slowly transitions the output of the inverter 116 to a logic low state. The logic low output of the NAND gate 112 is thus inverted by the inverter 116 to supply a second logic high input to the NOR gate 114. No change to the output of the NOR gate 114 is effected because the other input to the NOR gate 114 was already at a logic high state.

The signal RW may return to a logic low state at substantially the same time as the CLK signal when the clock timing expires. Counter bits C*<0>, C*<1>, C*<2>, as discussed hereinbelow, must have time to transition to new states before the output of the NOR gate 114 returns to a logic high state. As the CLK signal and the RW signal transition to logic low states, the output of the NAND gate 112 transitions to a logic high state. The inverter 116 slowly inverts the logic high level to a logic low level at the input of the NOR gate 114. This slow transition assures that the counter bits settle before the output of the NOR gate 114 transitions to a logic high state.

The output of the NOR gate 114 is input to an array of individual semiconductor devices 118. When the output of the NOR gate 114 is at a logic low state, a pull-up P-type transistor 120 is placed in a conducting state and a dynamic node 122 of the array 118 is precharged to a logic high state. When the dynamic node 122 is precharged, the voltage on the node is inverted to a logic low state by an inverter 124 to produce output signal CNT_LIMIT available at an output terminal. The state of the dynamic node 122 is held by a weak feedback inverter 126.

At the completion of the initiation of a read or write operation, the RW signal is driven to a logic low state and the output of the NOR gate 114 attains a logic high state after some delay time. When the output of the NOR gate 114 transitions to a logic high state, a pull-down N-type transistor 128 is turned on and provides a partial path to ground, i.e., a second node maintained at a desired voltage, for the array 118. The dynamic node 122 remains charged and the output signal CNT_LIMIT remains at a logic low state.

Burst length control signals BL1, BL2, BL4, and BL8 are input to pass transistors 130, 132, 134, and 136, respectively. The signals BL1, BL2, BL4, and BL8 are used to select the desired burst length of the memory device in which the detector 110 is included. As shown in FIG. 3, the transistors are connected in parallel columns of series connected transistors. As a result, for example, if the signal BL4 is active, the device will operate with a burst length of 4. The complementary outputs of the burst counter C*<0>, C*<1>, and C*<2> are input to pass transistors 138, 140 and 142, respectively. Signal SBW, which is input to a pass transistor 144, is used to indicate that only a single bit is to be written regardless of the burst length that is selected. Signal WRTMD, which is input to a pass transistor 146, is used to indicate that the memory device is being operated in write mode.

The circuit operation is as follows. All burst counter bits are reset when a new read or write opcode is detected. If that command is not validated by a CLK signal, the counter returns to its last valid count. If validated, all burst counter output bits remain at high logic level reset values for the duration of the logic high CLK signal. When the CLK signal transitions to a logic low state, the counter bits will increment, with C*<0> first transitioning from a logic high state to a logic low state. This method of resetting to the same state which will terminate the burst saves one counter at the expense of more critical timing as the output of the NOR gate 114 returns to a logic high state.

If, for example, a burst length of 4 is desired, the signal BL4 will be set to a logic high value and the signals BL1, BL2, and BL8 will be set to logic low values, thus placing the pass transistor 134 in a conducting state and placing the pass transistors 130, 132, and 136 in non-conducting states. The signals SBW and WRTMD will be set to logic low values, thus placing the transistors 144 and 146 in non-conducting states. The dynamic node 122 will remain charged until both the counter signals C*<1> and C*<0> are at logic high values (representing a logically complemented "4" at the burst counter outputs). When the counter signals C*<1> and C*<0> are at logic high values, the dynamic node 122 discharges through the pass transistors 134, 140, and 138 and through the pull-down transistor 128 to ground. When the dynamic node 122 discharges, the output signal of the inverter 124 transitions to a logic high value, thus signaling the end of the burst operation.

If, for example, it is desired that only a single bit be written to the memory device, the WRTMD and SBW signals are placed in logic high states. After the dynamic node 122 is precharged the transistors 144 and 146 are in conducting states and the dynamic node 122 discharges through the transistors 144 and 146 and the pull-down transistor 128. When the dynamic node 122 discharges, the output of the inverter 124 transitions to a logic high value, thus signaling the end of the single bit write operation.

Figure 4:
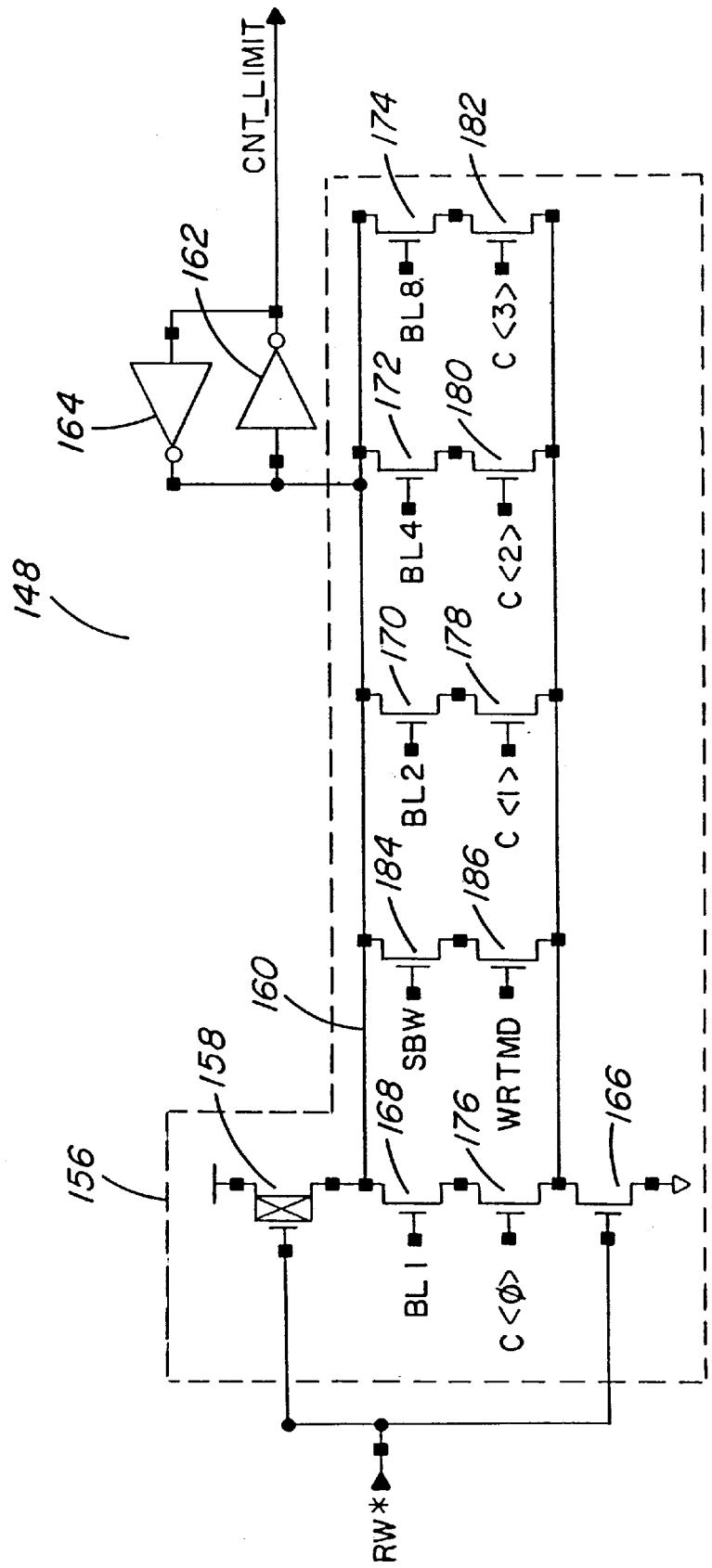
FIG. 4 is a circuit diagram illustrating a preferred embodiment of a burst length count determination detector.

FIG. 4 shows another preferred embodiment 148 of the burst length count determination detector circuit 94 of FIG. 2. RW* is at a logic low state as received from a decoder circuit such as that shown in FIG. 2A when CAS* and CS* are at logic low states and RAS* is at a logic high state, thus signalling a new burst read or write. This combination of signal values also causes the burst counter bits C<0> to C<3> to reset to logic low states. If a pulse of the system clock signal CLK is received, the counter begins to count in conventional binary fashion from zero by incrementing the current count once per falling edge transition of the system clock signal CLK. If no CLK pulse is received while the signals CAS* and CS* are in a reset state, the previous value of the counter bits will return. Thus, when a column operation is strobed with CAS* at a logic low state and RAS* at a logic high state, and the chip command decoder is enabled with CS*, the signal RW* will be at a logic low state.

This signal is input to an array of semiconductor devices 156. When RW* is at a logic low state, typically at the initiation of a column operation, a pull-up P-type transistor 158 precharges a dynamic node 160 of the array 156. When the dynamic node 160 is precharged, the voltage on the node is inverted to a logic low state by an inverter 162 to produce output signal CNT_LIMIT. The signal CNT_LIMIT is held by a feedback inverter 164.

At the completion of the initiation of a column operation, RW* attains a logic high state. RW* transitions to a logic high state, a pull-down N-type transistor 166 is turned on and provides a partial path to ground for the array 160. The dynamic node 160 remains charged and the output signal CNT_LIMIT remains at a logic low state.

Burst length control signals BL1, BL2, BL4, and BL8 are input to pass transistors 168, 170, 172, and 174, respectively. The signals BL1, BL2, BL4, and BL8 are used to select the desired burst length of the memory device in which the detector 148 is included. For example, if the signal BL4 is active, the device will operate with a burst length of 4. The outputs of the burst counter C<0>, C<1>, and C<2>, and C<3> are input to pass transistors 176, 178, 180 and 182, respectively. Signal SBW, which is input to a pass transistor 184, is used to indicate that only a single bit is to be written regardless of the burst length that is selected. Signal WRTMD, which is input to a pass transistor 186, is used to indicate that the memory device is being operated in write mode. This embodiment requires one more counter stage than the embodiment 110 of FIG. 3.

Figure 5:
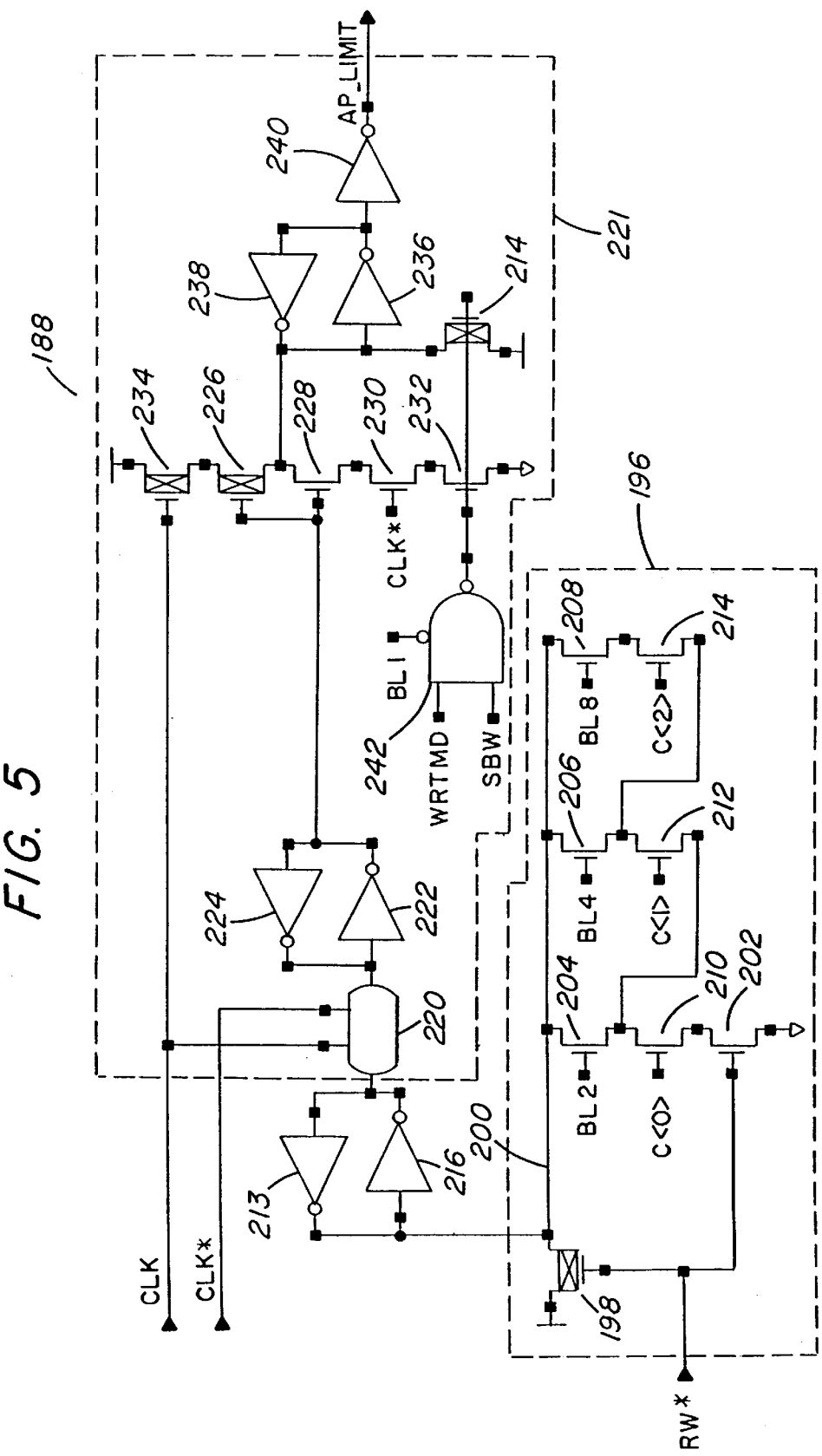
FIG. 5 is a circuit diagram illustrating a preferred embodiment of a burst length count determination detector.

FIG. 5 shows another preferred embodiment 188 of the burst length count determination detector circuit 94 of FIG. 2. When a column operation is strobed with the signals CAS* at a logic low state, RAS* at a logic high state, and the chip command decoder is enabled with the signal CS*, RW* will be at a logic low state.

RW* is input to an array of semiconductor devices 196. When RW* is at a logic low state, typically at the initiation of a column operation, a pull-up P-type transistor 198 precharges a dynamic node 200 of the array 188.

At the completion of the initiation of a column operation, the RW* signal is driven to a logic high state. When RW* transitions to a logic high state, a pull-down N-type transistor 202 is turned on and provides a partial path to ground for the array 196. The dynamic node 200 remains charged because there is no complete path to ground.

Burst length control signals BL2, BL4, and BL8 are input to pass transistors 104, 106, and 108, respectively. The signals BL2, BL4, and BL8 are used to select the desired burst length of the memory device in which the detector 188 is included. For example, if the BL4 is active, the device will operated with a burst length of 4. The outputs of the burst counter C<0>, C<1>, and C<2> are input to pass transistors 210, 212, and 214, respectively.

The dynamic node 200 is connected to an inverter 216, and the output of the inverter 216 (the logical complement of the voltage on the dynamic node) is held by a weak feedback inverter 218 which soft latches the dynamic node 200. The output of the inverter 216 is connected to a multiplexer 220 in an output circuit 221. The multiplexor 220 ensures that the value of output signal AP_LIMIT will not be dependent on the values of the burst counter signals C<0>, C<1>, and C<2>. Thus, if the burst counter signals C<0>, C<1>, and C<2> are reset by the transition of the signals CAS* and CS* to logic low values, the output signal AP_LIMIT will retain its logical value.

The output of the multiplexor 220 is connected to an inverter 222. The output of the inverter 222 is held by a feedback inverter 224. The inverters 222 and 224 thus form a latch. The output of the inverter 222 is connected to transistors 226 and 228. When the output of the inverter 222 is at a logic high value, the transistor 228 is in a conducting state, thus providing a partial path to ground through a transistor 230, which has the system clock signal CLK* as an input, and a transistor 232, which is connected to ground.

A pull-up transistor 234, which has the system clock signal CLK as an input, provides an active pull-up path for the output of the detector 188. When the output of the inverter 222 is at a logic low value and the signal CLK is at a logic low value, a conductive pull-up path to the output is provided through the transistors 226 and 234.

A terminal of the transistor 226 and a terminal of the transistor 228 are connected to an inverter 236, which is connected to a feedback inverter 238, thus forming a latch. The output of the inverter 236 is connected to an inverter 240, the output of which is the output of the detector 188, signal AP_LIMIT.

Figure 6:
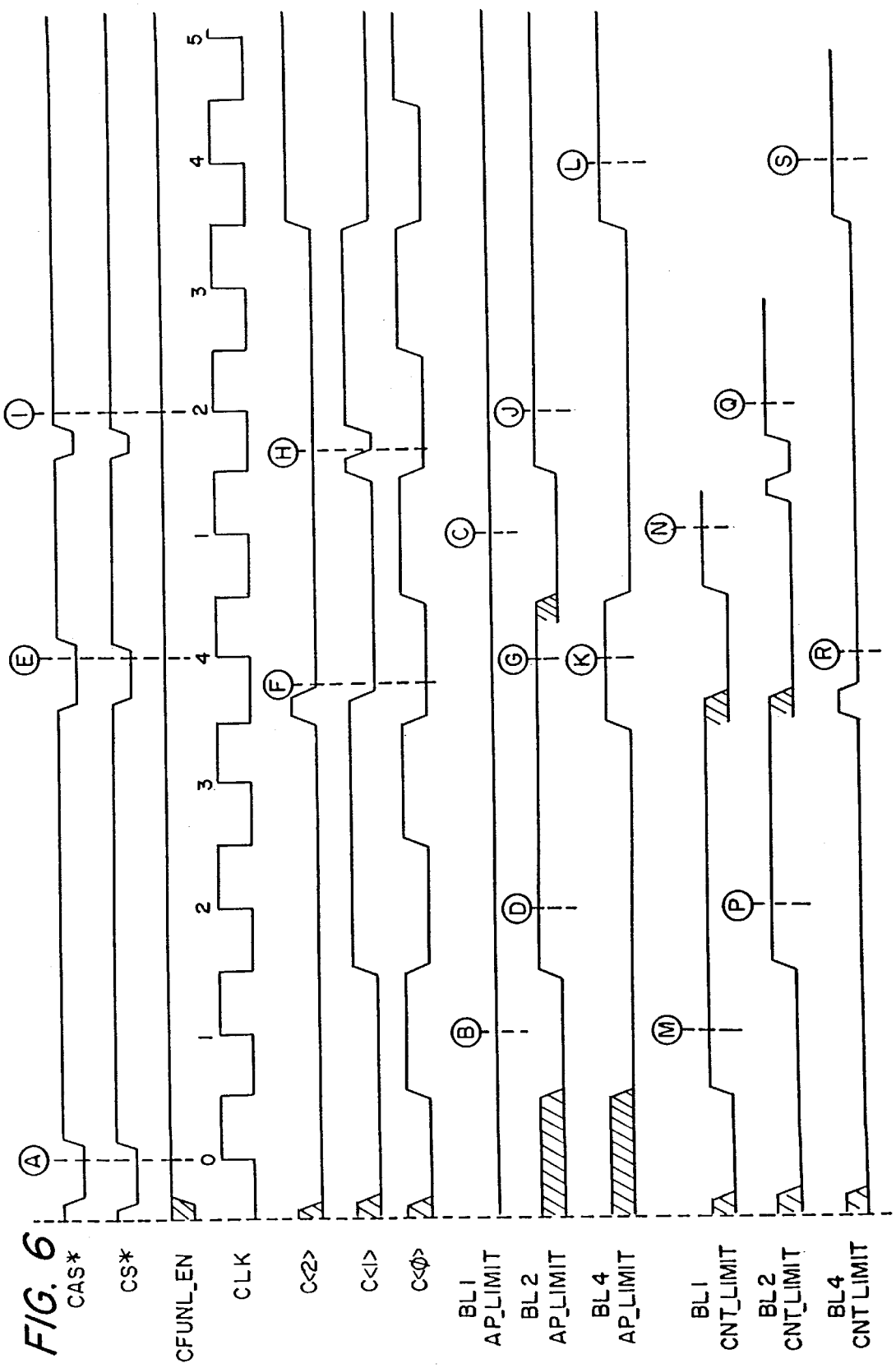
FIG. 6 is a timing diagram depicting the operation of the burst length count determination detector of FIGS. 3 and 4.

FIG. 6 illustrates a timing diagram of the circuit operation of the burst length count determination detectors of FIGS. 4 and 5. The output signal CNT_LIMIT of the burst length count determination detector 148 of FIG. 4 is illustrated in connection with selected burst lengths of 1, 2, and 4. The output signal AP_LIMIT of the burst length count determination detector 188 of FIG. 5 is illustrated in connection with selected burst lengths of 1, 2, and 4.

The signals CAS* and CS* are strobed to logic low states to denote that a column address operation will be performed. When the signals CS* and CAS* are strobed, the burst counter is reset, as denoted by the signals C<0>, C<1>, and C<2>, which attain logic low values. The signal RAS* is held at a logic high state to permit column operations. At pulse 0 of the CLK signal, denoted as point A in FIG. 6, it is recognized that a column operation has been initiated, and the burst counter starts to count. The least significant bit of the counter, C<0>, is the first counter bit to switch to a logic high state and the other counter bits C<1> and C<2> change sequentially.

If a burst count length of 1 is selected for the embodiment shown in FIG. 5 the NAND gate 242 will be enabled and a logic low state appears at the gate terminal of the transistor 214. The transistor 214 provides a path to VCC for the output signal AP_LIMIT, as denoted by BL1 AP_LIMIT in FIG. 6. After double inversion by the inverters 236 and 210, the output signal AP_LIMIT remains at a logic high state. The end of the burst length count is recognized on the rising edge of the first system clock signal CLK pulse after the reset and the C<0> signal transitions to a logic high state, as represented in FIG. 6 as points B and C.

The signal BL2 AP_LIMIT in FIG. 6 represents the selection of a burst count length of 2 in connection with the burst length count determination detector 188 of FIG. 5. When the signal C<Ø> transitions to a logic high state, representing a "1" in the burst counter, the dynamic node 200 is discharged, the output circuit 221 counts one full clock cycle, then the output signal AP_LIMIT transitions to a logic high value, and is recognized on the rising edge of the second CLK signal pulse after the column operation initiates and the C<Ø> signal transitions to a logic high state, as represented in FIG. 6 as point D. At point E in FIG. 6, the signals CAS* and CS* are recognized as initiating a column operation. Although initiation of the column operation caused the counter to reset, as indicated at point F, the output signal AP_LIMIT remains valid and is recognized at point G. Similarly, when the signals CAS* and CS* are strobed, the counter resets momentarily, as indicated at point H. The signals CAS* and CS* are not at logic low (active) states at the rising edge of the signal CLK, as indicated at point I, and therefore the initiation of the column operation was unclocked. However, the signal AP_LIMIT does not transition as is recognized at point J, and is not invalid due to the unclocked reset.

The signal BL4 AP_LIMIT in FIG. 6 represents the selection of a burst count length of 4 in connection with the burst length count determination detector 188 of FIG. 5. The output signal AP_LIMIT transitions to a logic high value following the transition of the counter bits C<∅> and C<1> to logic high values, and the output signal AP_LIMIT is recognized and is valid at point K, even though the counter was reset at point F. The output signal AP_LIMIT is recognized at point L on the second rising edge of the CLK signal after the counter bits C<∅> and C<1> transition to logic high states.

When a burst length count of 1 is selected in connection with the burst length count determination detector 148 of FIG. 4, the resulting output signal CNT_LIMIT is represented in FIG. 6 as BL1 CNT_LIMIT. When the least significant bit of the counter, C<0>, transitions to a logic high state after the column operation is initiated by the strobing of the signals CAS* and CS*, the output signal CNT_LIMIT transitions to a logic high state. The output signal is recognized at the first rising edge of the CLK signal following the transition of CNT_LIMIT, shown as point M in FIG. 6. Similarly, after the second column operation is initiated, the output signal CNT_LIMIT transitions to a logic high state and is recognized at point N.

The signal BL2 CNT_LIMIT represents the selection of a burst length count of 2 in connection with the burst length count determination detector 148 of FIG. 4. When the counter bit C<1> transitions to a logic high state, the output signal CNT_LIMIT transitions to a logic high state and is recognized at point P. When an unclocked reset of the counter at point H occurs, the output signal CNT_LIMIT transitions to a logic low state, but because the counter reset was invalid, the counter bit C<1> recovers and the CNT_LIMIT signal transitions high. The output signal CNT_LIMIT is recognized at point Q.

When a burst length count of 4 is selected in connection with the burst length count determination detector 148 of FIG. 4, the resulting output signal is represented as BL4 CNT_LIMIT in FIG. 6. When the counter bit C<2> transitions to a logic high state, the output signal CNT_LIMIT transitions to a logic high state. Because the burst counter is effectively reset at point F and the counter bit C<2> transitions to a logic low state, the output signal transitions to a logic low state. Thus, the output signal CNT_LIMIT is not recognized at a logic high state at point R. Because the attempted reset at point H was unclocked, the counter resumes counting and when the counter bit C<2> transitions to a logic high state, the output signal transitions to a logic high state and is recognized at point S in FIG. 6.

Figure 7:
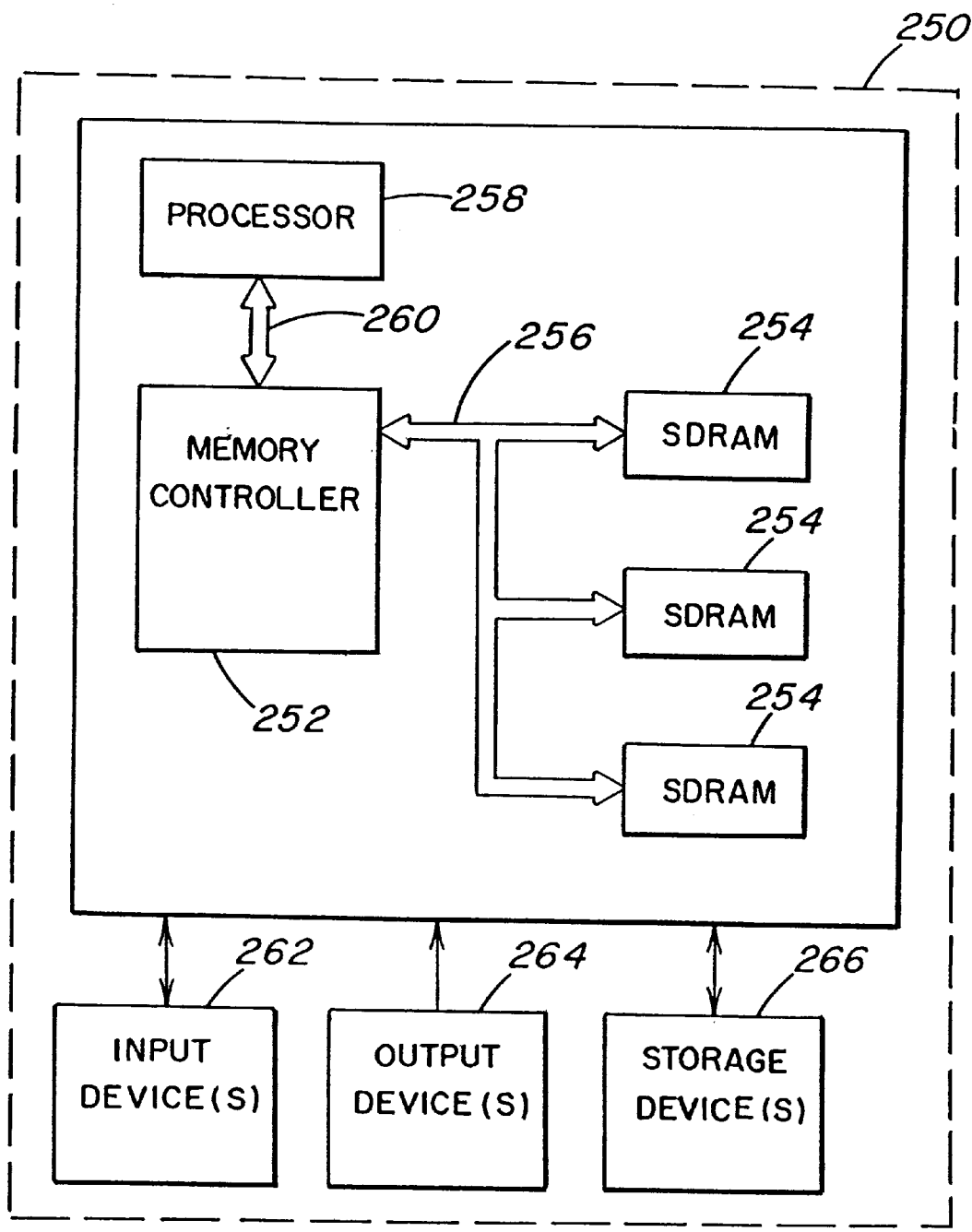
FIG. 7 is a system diagram illustrating a computer system in which the present invention may be used.

FIG. 7 illustrates a computer system 250. The computer system 250 utilizes a memory controller 252 in communication with SDRAMs 254 through a bus 256. The memory controller 252 is also in communication with a processor 258 through a bus 260. The processor 258 can perform a plurality of functions based on information and data stored in the SDRAMs 254. The SDRAM 254 can contain the burst length count determination detector of the present invention. One or more input devices 262, such as a keypad or a mouse, are connected to the processor 258 to allow an operator to manually input data, instructions, etc. One or more output devices 264 are provided to display or otherwise output data generated by the processor 258. Examples of output devices include printers and video display units One or more data storage devices 266 may be coupled to the processor 258 to store data on, or retrieve information from, external storage media. Examples of storage devices 266 and storage media include drives that accept hard and floppy disks, tape cassettes, and CD read only memories. It can be understood by those skilled in the art that the present invention may be incorporated into any type of synchronous memory device, including synchronous static random access (SRAM) devices.

The present invention also contemplates a method for detecting the end of a burst count in a semiconductor memory device The method comprises the step of receiving a plurality of output bits from a burst counter and a plurality of burst length selection bits. The method further comprises the step of driving a dynamic node of an array of semiconductor devices to a first voltage representative of a first logic state. The method also includes the step of driving the dynamic node to a second voltage representative of a second logic state when the burst counter output bits reach a predetermined count corresponding to the burst length selection bits. The method also includes dynamically programming the burst length counter. That is accomplished by dynamically changing the desired burst count by changing the burst counter output bits.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A circuit for detecting an end of a burst count in a semiconductor memory device, comprising a plurality of parallel-connected transistor pairs, each pair connected between a dynamic node and a second node, wherein each pair includes:

a first transistor having a control terminal connected to a separate burst length selection bit line and having a conduction path between a first terminal and a second terminal, wherein the first terminal is connected to the dynamic node; and a second transistor having a control terminal connected to a separate burst counter bit line and having a conduction path between a first terminal and a second terminal, wherein the first terminal is connected to the second terminal of the first transistor of the pair and the second terminal is connected to the second node.

2. The circuit of claim 1, wherein the second node is maintained at a static voltage.

3. The circuit of claim 1, wherein the dynamic node is connected to an output terminal of the circuit via an output circuit.

4. The circuit of claim 3, wherein the output circuit includes a pair of oppositely-connected inverters connected between the dynamic node and the output terminal of the circuit.

5. The circuit of claim 1, further comprising an additional transistor pair connected between the dynamic node and the second node, wherein the additional pair includes:

a first transistor having a control terminal connected to a single bit write line; and a second transistor having a control terminal connected to a memory device write mode line.

6. The circuit of claim 5, wherein the first transistor of the additional transistor pair includes a conduction path between a first terminal and a second terminal, wherein the first terminal is connected to the dynamic node, and the second transistor of the additional transistor pair includes a conduction path between a first terminal and a second terminal wherein the first terminal is connected to the second terminal of the first transistor and the second terminal is connected to the second node.

7. The circuit of claim 1, wherein the dynamic node is connected to a first voltage rail via a pull-up transistor.

8. The circuit of claim 7, wherein the pull-up transistor includes a p-type transistor.

9. The circuit of claim 7, wherein the second node is connected to a second voltage rail via a pull-down transistor.

10. The circuit of claim 9, wherein the pull-down transistor includes an n-type transistor.

11. A circuit for detecting an end of a burst count in a semiconductor memory device, comprising:
   a plurality of parallel-connected transistor pairs, each pair connected between a dynamic node and a second node, wherein each pair includes a first transistor responsive to a separate burst length selection bit and a second transistor responsive to a separate burst counter bit;
   a pull-up transistor having a conduction path between a first terminal and a second terminal, wherein the first terminal is connected to a first voltage rail and the second terminal is connected to the dynamic node; and
   a pull-down transistor having a conduction path between a first terminal and a second terminal, wherein the first terminal is connected to the dynamic node and the second terminal is connected to the second node.

12. The circuit of claim 11, wherein both the pull-up transistor and the pull-down transistor include a control terminal connected to an output terminal of a first logic circuit.

13. The circuit of claim 12, wherein the first logic circuit includes a NOR gate having a first input terminal connected to a decoder circuit, a second input terminal connected to the decoder circuit via a second logic circuit, and an output terminal connected to the control terminal of the pull-up transistor and the control terminal of the pull-down transistor.

14. The circuit of claim 13, wherein the second logic circuit includes a NAND gate having a first input terminal connected to a clock line, a second input terminal connected to the decoder circuit, and an output terminal connected to the second input terminal of the first logic circuit.

15. The circuit of claim 14, wherein the output terminal of the second logic circuit is connected to the second input terminal of the first logic circuit via an inverter.

16. The circuit of claim 15, wherein the decoder circuit includes:
   a third logic circuit having a first input terminal connected a column address strobe line, a second input terminal connected to a chip select line, and an output terminal;
   a fourth logic circuit having a first input terminal connected to a row address strobe line, a second input terminal connected to the output terminal of the third logic circuit, and an output terminal; and
   an inverter having an input terminal connected to the output terminal of the fourth logic circuit.

17. The circuit of claim 16 wherein the third logic circuit includes a NOR gate and the fourth logic circuit includes a NAND gate.

18. A column address logic circuit, comprising:
   a burst counter;
   a column address counter; and
   a burst length count determination detector circuit in communication with the burst counter and the column address counter, wherein the detector circuit includes a plurality of parallel-connected transistor pairs, each pair connected between a dynamic node and a second node, wherein each pair includes:
      a first transistor having a control terminal connected to a separate burst length selection bit line and having a conduction path between a first terminal and a second terminal, wherein the first terminal is connected to the dynamic node; and
      a second transistor having a control terminal connected to a separate burst counter bit line and having a conduction path between a first terminal and a second terminal, wherein the first terminal is connected to the second terminal of the first transistor of the pair and the second terminal is connected to the second node.

19. The column address logic circuit of claim 18, wherein the dynamic node of the detector circuit is connected to the column address counter via an output circuit of the detector circuit.

20. The column address logic circuit of claim 18, wherein the control terminal of the second transistor of each transistor pair is connected to an output terminal of the burst counter.

21. A memory device, comprising:
   a memory array;
   a column address logic circuit in communication with the memory array, the column address logic circuit including:
      a burst counter;
      a column address counter; and
      a burst length count determination detector circuit in communication with the burst counter and the column address counter, wherein the detector circuit includes a plurality of parallel-connected transistor pairs, each pair connected between a dynamic node and a second node, wherein each pair includes:
         a first transistor having a control terminal connected to a separate burst length selection bit line and having a conduction path between a first terminal and a second terminal, wherein the first terminal is connected to the dynamic node; and
         a second transistor having a control terminal connected to a separate burst counter bit line and having a conduction path between a first terminal and a second terminal, wherein the first terminal is connected to the second terminal of the first transistor of the pair and the second terminal is connected to the second node.

22. The memory device of claim 21, wherein the column address counter is in communication with the memory array via an address bus.

23. A system, comprising:
   a processor; and
   a memory device in communication with the processor, the memory device including a memory array and a column address logic circuit in communication with the memory array, wherein the column logic address circuit includes:
      a burst counter;
      a column address counter; and
      a burst length count determination detector circuit in communication with the burst counter and the column address counter, wherein the detector circuit includes a plurality of parallel-connected transistor pairs, each pair connected between a dynamic node and a second node, wherein each pair includes:
         a first transistor having a control terminal connected to a separate burst length selection bit line and having a conduction path between a first terminal and a second terminal, wherein the first terminal is connected to the dynamic node; and a second transistor having a control terminal connected to a separate burst counter bit line and having a conduction path between a first terminal and a second terminal, wherein the first terminal is connected to the second terminal of the first transistor of the pair and the second terminal is connected to the second node.

24. The system of claim 23, wherein the processor is in communication with the memory device via a memory controller.

25. The system of claim 24, wherein the memory device is one of a plurality of memory devices in communication with the processor via the memory controller.

26. A circuit for detecting an end ot a burst count in a semiconductor memory device, comprising:

a plurality of parallel-connected transistor pairs, each pair connected between a dynamic node and a second node, wherein each pair includes a first transistor having a control terminal connected to a separate burst length selection bit line and a second transistor having a control terminal connected to a separate burst counter bit line; and an additional transistor pair connected between the dynamic node and the second node, wherein the additional pair includes a first transistor having a control terminal connected to a single bit write line and a second transistor having a control terminal connected to a memory device write mode line.

27. The circuit of claim 26, wherein the dynamic node is connected to an output terminal of the circuit via an output circuit.

28. The circuit of claim 27, wherein the output circuit includes a pair of oppositely-connected inverters connected between the dynamic node and the output terminal of the circuit.

29. The circuit of claim 26, wherein the first transistor of the additional transistor pair includes a conduction path between a first terminal and a second terminal, wherein the first terminal is connected to the dynamic node, and wherein the second transistor of the additional transistor pair includes a conduction path between a first terminal and a second terminal, wherein the first terminal is connected to the second terminal of the first transistor of the additional transistor pair and the second terminal is connected to the second node.

30. The circuit of claim 29, wherein the dynamic node is connected to a first voltage rail via a pull-up transistor.

31. The circuit of claim 29, wherein the second node is connected to a second voltage rail via a pull-down transistor.

32. A column address logic circuit comprising:

a burst counter;

a column address counter; and a burst length count determination detector circuit in communication with the burst counter and the column address counter, wherein the detector circuit includes:

a plurality of parallel-connected transistor pairs, each pair connected between a dynamic node and a second node, wherein each pair includes a first transistor having a control terminal connected to a separate burst length selection bit line and a second transistor having a control terminal connected to a separate burst counter bit line; and an additional transistor pair connected between the dynamic node and the second node, wherein the additional pair includes a first transistor having a control terminal connected to a single bit write line and a second transistor having a control terminal connected to a memory device write mode line.

33. The column address logic circuit of claim 32, wherein the dynamic node of the detector circuit is connected to the column address counter via an output circuit of the detector circuit.

34. The column address logic circuit of claim 32, wherein the control terminal of the second transistor for each of the plurality of parallel-connected transistor pairs is connected to an output terminal of the burst counter.

35. A memory device, comprising:

a memory array;

a column address logic circuit in communication with the memory array, the column address logic circuit including:

a burst counter;

a column address counter; and a burst length count determination detector circuit in communication with the burst counter and the column address counter, wherein the detector circuit includes:

a plurality of parallel-connected transistor pairs, each pair connected between a dynamic node and a second node, wherein each pair includes a first transistor having a control terminal connected to a separate burst length selection bit line and a second transistor having a control terminal connected to a separate burst counter bit line; and an additional transistor pair connected between the dynamic node and the second node, wherein the additional pair includes a first transistor having a control terminal connected to a single bit write line and a second transistor having a control terminal connected to a memory device write mode line.

36. A system, comprising:

a processor; and a memory device in communication with the processor, the memory device including a memory array and a column address logic circuit in communication with the memory array, wherein the column logic address circuit includes:

a burst counter;

a column address counter; and a burst length count determination detector circuit in communication with the burst counter and the column address counter, wherein the detector circuit includes:

a plurality of parallel-connected transistor pairs, each pair connected between a dynamic node and a second node, wherein each pair includes a first transistor having a control terminal connected to a separate burst length selection bit line and a second transistor having a control terminal connected to a separate burst counter bit line; and an additional transistor pair connected between the dynamic node and the second node, wherein the additional pair includes a first transistor having a control terminal connected to a single bit write line and a second transistor having a control terminal connected to a memory device write mode line.

37. The system of claim 36, wherein the memory device is one of a plurality of memory devices in communication with the processor via a memory controller.

* * * * *

UNITED STATES PATENT AND TRADEMARK OFFICE
CERTIFICATE OF CORRECTION

PATENT NO.   : 6,067,273
DATED        : May 23, 2000
INVENTOR(S)  : Morgan

It is certified that error appears in the above-identified patent and that said Letters Patent is hereby corrected as shown below:

Column 4,
Line 55, after the word "of", please delete the word "Lime" and insert the word
-- time -- therefor.

Column 7,
Line 42, immediately preceding the designation "BL4", please insert the word
-- signal --.
Line 43, please delete the word "operated" and insert the word -- operate -- therefor.

Column 9,
Line 63, after the word "units", please insert the punctuation mark -- . --.

Column 10,
Line 8, after the word "device", please insert the punctuation mark -- . --.

Column 13, claim 26,
Line 14, after the words "detecting an end", please delete the letters "ot" and insert the word -- of -- therefore.

Signed and Sealed this

Twenty-seventh Day of November, 2001

*Attest:*

NICHOLAS P. GODICI
*Attesting Officer*     Acting Director of the United States Patent and Trademark Office